United States Patent [19]
Axelbaum et al.

[11] Patent Number: 5,498,446
[45] Date of Patent: Mar. 12, 1996

[54] METHOD AND APPARATUS FOR PRODUCING HIGH PURITY AND UNAGGLOMERATED SUBMICRON PARTICLES

[75] Inventors: Richard L. Axelbaum; Douglas P. DuFaux, both of St. Louis, Mo.

[73] Assignee: Washington University, St. Louis, Mo.

[21] Appl. No.: 248,655

[22] Filed: May 25, 1994

[51] Int. Cl.⁶ ..................................................... B05D 7/00
[52] U.S. Cl. ........................... 427/212; 427/215; 427/216; 427/248.1; 427/255.1; 427/154; 427/156; 431/4; 431/351; 264/7
[58] Field of Search .................................... 427/215, 216, 427/248.1, 255.1, 156, 154; 264/7; 431/4, 351

[56] References Cited

U.S. PATENT DOCUMENTS

| | | | |
|---|---|---|---|
| 4,891,339 | 1/1990 | Calcote et al. | 501/87 |
| 4,994,107 | 2/1991 | Flagan et al. | 75/367 |
| 5,021,221 | 6/1991 | Gould et al. | 422/129 |
| 5,128,081 | 7/1992 | Siegel et al. | 264/81 |
| 5,230,729 | 7/1993 | McCandish et al. | 75/351 |

OTHER PUBLICATIONS

Twenty–Fourth Symposium on Combustion/The Combustion Institute article entitled *A New Gas–Phase Combustion Synthesis Process for Pure Metals, Alloys, and Ceramics*, 1992/pp. 1869–1876.

AeroChem Research Laboratories, Government Report on Production and Coating of Pure Boron Powders, Mar. 30, 1990.

*Primary Examiner*—Shrive Beck
*Assistant Examiner*—David M. Maiorana
*Attorney, Agent, or Firm*—Rogers, Howell & Haferkamp

[57] ABSTRACT

A method and apparatus for reacting sodium vapor with gaseous chlorides in a flame to produce nanoscale particles of un-oxidized metals, composites and ceramics. The flame is operated under conditions which lead to condensation of a NaCl by-product onto the particles. The condensate encapsulates the particles and aids in controlling desired particle size and preventing undesirable agglomeration among the particles during synthesis. Following synthesis, oxidation of the particles is inhibited by the encapsulation and handling character of the products is greatly enhanced. Electron microscopy has revealed that synthesized products are composed of discrete nanoparticles in a NaCl matrix. The NaCl encapsulate has been effectively removed from the particles by both washing and known sublimation technique at 800° C. under low pressure.

46 Claims, 7 Drawing Sheets

METHOD AND APPARATUS FOR PRODUCING HIGH PURITY AND UNAGGLOMERATED SUBMICRON PARTICLES

This invention was made with government support under grand number ECS 9119006 awarded by the National Science Foundation. The government has certain rights in the invention.

FIELD OF THE INVENTION

This invention relates to a development in the production of sub-micron particles and, more particularly, to a development in the flame synthesis of unagglomerated, nanometer-sized particles of characteristically high purity.

DESCRIPTION OF THE RELATED ART

Fine powder materials synthesis is finding particular application in the fields of powder metallurgy, semiconductors, magnetics and ceramics. In each of these fields, the synthesis of high-purity, nanometer-sized particles or "nanoparticles" is considered highly desirable. Primary nanoparticles in the 1–100 nm size range permit the creation of materials with carefully controlled properties. In view of the desirability of the particles, as described, several methods for synthesizing sub-micron particles have been developed.

In U.S. Pat. No. 4,994,107 to Flagan et al., a method of producing sub-micron, non-agglomerated particles in a single stage flow reactor is disclosed. The method entails introducing a reactant or mixture of reactants at one end while varying temperature along the flow path within the reactor at different zones to initiate low-rate, progressive reactions. The procedure described in this patent is directed at producing silicon particles in the size range of 0.05–0.5 microns by decomposing electronic grade silane in high purity nitrogen. The carefully monitored reaction results in an aerosol dispersion of silicon particles of the desired size. At column 5, lines 43–55 and at column 6, lines 23–56 and elsewhere, it is explained that special reaction conditions are required to prevent "coagulation" among particles of desired size during the reaction and at the time of collecting the product and placement into a sealed container. However, this reference neither discloses nor suggests a method for coating the silicon particles.

Another effort to create nanometer-sized particles has been made by Siegel et al. as disclosed in U.S. Pat. No. 5,128,081. In this disclosure, methods are revealed for making a variety of oxide nanoparticles comprised of, among other things, titanium, magnesium, aluminum and zinc. The procedure involves evacuating a chamber to low pressure and introducing a vaporous oxidizable composition of one of the above metals. Condensation is then effected and the nanometer-sized particles are subsequently oxidized and recovered. While this reference discloses a method for making nanoparticles, it is limited to specific metals and oxides. Also, energy costs are high and production rates are low. U.S. Pat. No. 5,230,729 to McCandlish et al. discloses a complex procedure involving considerable pre-treatment of starting materials followed by a vapor infiltration reaction in a fluid bed reactor to produce nanoparticle tungsten carbide and cobalt powders consisting of a network of fine grains measuring less than 100 nanometers.

Another particle production method was described by Calcote et al. in their paper entitled "A NEW GAS-PHASE COMBUSTION SYNTHESIS PROCESS FOR PURE METALS, ALLOYS, AND CERAMICS" which was delivered in 1992 at the Twenty-Fourth International Symposium on Combustion sponsored by the Combustion Institute. The method involves injecting suitable reactants into a reactor (resembling a liquid propellant rocket motor) where they react hypergolically, and expanding the products through a nozzle to produce a supersonic stream in such a way as to divert the by-product gas away from a container into which the aerosol product is deposited. While this reference discusses the reaction of reactive metals with metal halides, it provides only a discussion of a mechanical separation method for producing pure particles. Work related to that of Calcote et al. is disclosed in U.S. Pat. No. 5,021,221 to Gould et al. Therein, the fundamental chemistry involved in the present invention is discussed. Interestingly, Gould et al., in discussing the reaction of sodium with silicon tetrachloride observed that, if the reaction occurred in a cool reactor, "the sodium chloride would condense and silicon and sodium chloride would then rapidly freeze so that the resulting product would be very fine brown powder made up of 90% by weight salt particles and 10% by weight submicron sized silicon particles which has little value." From this comment, the inventors are unable to discern just what was produced by Gould et al. If the reactor was too cool, separate discrete particles of silicon and sodium chloride would have been produced, which is exactly what is reported. Furthermore, Gould et al. immediately compact the silicon particles into a block such that any coating on the discrete particles would lower the purity of the block and interfere with achieving the purposes of the disclosed method. As such, it is believed that Gould et al. teach away from coating any discrete particles in their method.

Accordingly, none of the references herein discussed disclose or suggest a method for efficiently synthesizing an unagglomerated nanoparticle of characteristically high-purity by controlling partial pressures and temperature or otherwise utilizing a condensation technique to coat the discrete particles. Thus, the art has lacked a relatively simple, high-production-rate method for effectively synthesizing high purity, unagglomerated nanoparticles in a continuous process. The invention disclosed and claimed herein achieves these advantages in a manner not disclosed or suggested by the prior art.

SUMMARY OF THE INVENTION

The method and apparatus of the present invention constitutes an effective and comparatively simple means for producing high-purity, unagglomerated particles of a nanoscale dimension. Both the method and apparatus are simple in their manner of performance and/or operation. They utilize readily available materials and, together, represent a significant advance in the state of the art of flame synthesis. The condensation technique employed in the present invention represents yet an additional significant advance over the known art in that, in addition to the advantages already cited, it provides a heretofore unknown means for synthesizing high purity nanoparticles of an established size having a removable coating which protects the particles from oxidation. Accordingly, the handling and storage character of the synthesized particles are readily enhanced.

Generally, the present invention involves a sodium flame process and adapted apparatus, applicable to a broad class of materials, for synthesizing unagglomerated and non-oxidized nanoparticles. Representative materials include pure metals, intermetallics, ceramics and composites. The basic approach is to feed a combination of vaporized element/ metal halides into a reactive-metal vapor/inert-gas environment to create a flame that produces metals, intermetallics, non-oxide or oxide ceramics and composites. The nucleation and growth of primary particles proceeds normally in the flame and, in the absence of partial pressure and temperature control, results in the formation of hard agglomerated products. Hard agglomerates lack utility in critical powder applications because product particles have poor sintering characteristics.

The previous description discloses a process wherein the primary particles and the condensable vapor for coating the primary particles are products of a combustion process. The scope of this invention is not limited to flame-generated particles or coating materials, however. For example, the primary particles can be produced in a flow reactor as in Flagan et al. or by condensation from a vapor as in Siegel et al. Furthermore, the coating-material can be a product of a reaction although it need not be. For example, NaCl can be vaporized and introduced into the aerosol environment and then the encapsulation process would proceed in the same manner as disclosed above. The necessary features of the method are only that there be an aerosol in an environment containing a condensable vapor.

Until now, flame synthesis has not been relied upon for the production of optimally sized fine particles in the size range of 1–100 nanometers due to an inability to control the rapid onset of hard agglomeration. When practiced in accordance with the method and apparatus of the present invention, however, flame synthesis can be relied upon to produce unagglomerated nanoscale particles of a desired size. Furthermore, when temperature and partial pressure are controlled in accordance with the teaching herein, a coating phenomenon occurs which effectively encapsulates desirably sized product particles in a salt matrix. Product encapsulation achieves two substantial advantages. First, when coating is triggered, growth of the product is immediately arrested which both results in a product of a desired size as well as prevents the onset of undesirable agglomeration. Second, the coating matrix has proven to be a barrier to ambient compositions which would threaten the purity of the product. Handling character of the encapsulated product is thereby greatly enhanced.

The encapsulation phenomenon can be passively triggered when, under correspondingly appropriate conditions of temperature and pressure, vaporous reactive metal and halide reactants react to form a condensate that encapsulates the desired products of the flame synthesis when they have grown to a desired size. Appropriate reaction conditions, including corresponding temperature and partial pressure values, have been determined which enable the flame synthesis of homogeneous and unagglomerated particles in the desirable size range of about 4–30 nanometers. Encapsulation can also be suppressed and then actively triggered at an appropriate time by a sudden drop in temperature to produce even larger particles of controlled size. Flame synthesis products, which include particles and gas, are convected away from the flame or reaction zone to a filter through which the gas passes to an ultimate exhaust vent and on which the encapsulated particle product is deposited for collection. Minimal special handling or storage precautions need be taken with respect to the encapsulated product in order to preserve its purity. When desired for use, the encapsulated product may be suitably washed in either water or a glycerin solution if the product particles are water sensitive. Conventional sublimation at 800° C. at low pressure is yet another known way to remove the salt matrix coating. Still another method of removing the coating is to vaporize it.

BRIEF DESCRIPTION OF THE DRAWINGS

FIG. 1 is a schematic diagram showing a representative reaction process diagram for the flame synthesis of the present invention;

FIGS. 2*a* and 2*b* are schematic diagrams showing two arrangements for introducing reactants and forcing condensation coating on particles;

FIG. 3 is an enlarged schematic of the burner with reactor tube removed over which is a photograph of an actual coflow flame shown in the laminar regime;

FIG. 4 is a graph which shows the plottings of partial pressure of NaCl versus temperature detailing the process variables of the present invention when desired nanoscale particles in the 4–30 nanometer range are desired;

FIG. 5 is an x-ray diffraction pattern (XRD) of a typical as-produced sample of elemental Ti produced in accordance with the conditions for Flame A of Table 1;

FIGS. 6*a* and 6*b* contain images generated by transmission electron microscope of collected particles from Flame A (6*a*) and Flame B (6*b*), the conditions of which are shown in Table 1; and FIG. 7 is an x-ray diffraction pattern (XRD) of a typical washed sample of $TiB_2$ produced in accordance with the conditions for Flame B of Table 1.

DETAILED DESCRIPTION OF THE PREFERRED EMBODIMENT

In accordance with the method and apparatus of the present invention, high-purity, unagglomerated nanoscale particles of un-oxidized metals, intermetallics, ceramics and composites are produced by vaporizing an element/metal halide such as titanium tetrachloride and/or boron trichloride and an appropriate alkali or reducing metal, such as sodium, and reacting the two vaporous materials in a flame within an environment of an inert gas such as argon to produce high-purity nanoscale elemental titanium or titanium diboride particles encapsulated in a NaCl matrix.

The basic approach is to allow the nucleation and growth of the primary particles to proceed normally but then encapsulate these particles with an appropriate material when they have grown to the required size and before they begin to agglomerate. Thus, while the encapsulated particles will agglomerate, the primary particles within them will not. As explained, encapsulation is accomplished by coating the particles with a by-product of the combustion process chosen for this purpose. The coating is triggered to occur thermodynamically or through mixing or a separate chemical reaction and must be a material that can be completely removed at some later time, for example by heat treating or washing. Depending on the application, identifying an appropriate material for coating may be reasonably determined without undue experimentation. The present invention successfully employs sodium chloride and the process of coating is triggered by thermodynamic variables.

Sodium chloride is an excellent candidate for a coating material for a number of reasons. First, its saturation temperature is 1465° C. Thus, coating can be triggered by controlling vapor pressure and temperature. Also, as discussed below, it is possible to adjust temperature and pressure in such a way as to attain control of particle size (diameter) for $D_p$<30 nm. Second, NaCl can be efficiently removed by washing, due to its high solubility in water. If the particles are water sensitive, the coating can be removed by a glycerin wash or sublimation at 800° C. in vacuum.

Third, the NaCl coating can protect air-sensitive samples during post-flame handling, a critical requirement for powders of elemental titanium, for example, which are known to readily oxidize to form $TiO_2$.

NaCl can be introduced with the reactants or be a by-product of combustion, depending upon the chemistry of the desired synthesis. The present invention, however, preferably employs a by-product of the combustion process. The products considered are titanium and titanium diboride and the overall chemistry for these exothermic hypergolic reactions is $$TiCl_4 + 4Na \rightarrow Ti + 4NaCl \quad (1)$$

$$TiCl_4 + 2BCl_3 + 10Na \rightarrow TiB_2 + 10NaCl \quad (2)$$

This chemistry is particularly well suited for NaCl encapsulation because 1) the thermodynamic yield is nearly 100% and is independent of temperature provided the flame temperature is not too high (<1700° C.), and 2) the reactions occur even at very low temperatures (<400° C.). This combination is ideal for controlling encapsulation because coating can be turned on or off by controlling the partial pressure of NaCl and temperature.

Still other chemical reactions may be utilized in accordance with the present invention. Other examples include:

$$TiCl_4 + 4NaOH \rightarrow TiO_2 + 2H_2O + 4NaCl$$

This reaction would produce salt which will condense over the $TiO_2$ to produce unagglomerated, coated $TiO_2$ nanophase particles.

Still another reaction is:

$$TiCl_4 + 2H_2 + O_2 + 4NaOH \rightarrow TiO_2 + 4H_2O + 4NaCl$$

This reaction produces $TiO_2$ in a manner similar to present commercial methods except the addition of NaOH converts the HCl by-product into NaCl, which coats the nanophase particles in accordance with the teaching of the present invention.

Developing the encapsulation approach in order to produce nanophase materials necessarily entails the construction of a burner useful for studying the structure of the reaction zone and the particle nucleation, growth, and coating processes. The burner preferably produces a continuous stable flame and has convenient access for optical and physical probes. Known reactors and burners that have been developed to date for the halide/reactive-metal reactions include: 1) a rocket-motor reactor, 2) suspended droplet, 3) flow reactor and 4) a prototype batch-mode burner. Each of these systems has its advantages; however, they fall short of being continuous and/or easily accessible. Therefore, an alternative flame configuration has been developed in accordance with the present invention that resembles the simple coflow or jet hydrocarbon flame. The flame functioned effectively and conveniently experimentally, and it is believed that it would, similarly, perform were it scaled-up for industrial application.

Figure 3:
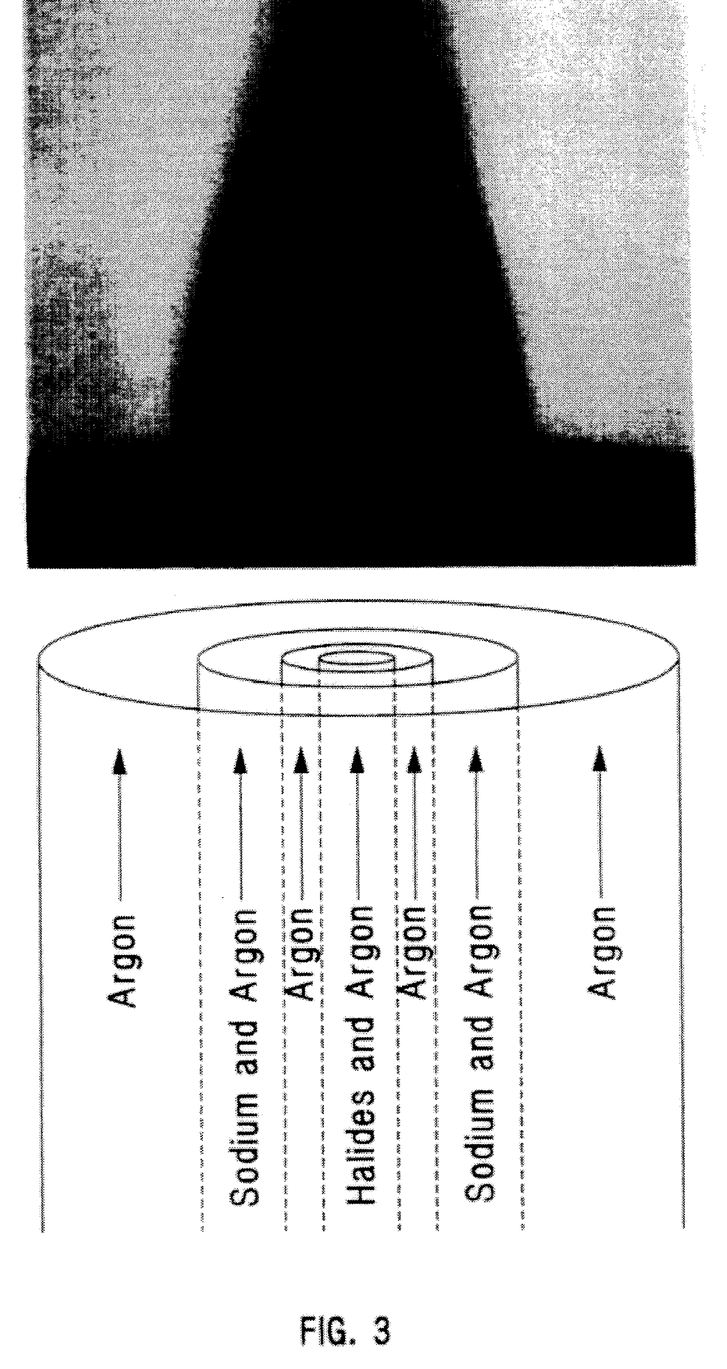

The cylindrical coflow burner developed for flame synthesis in accordance with the present invention is shown schematically and in conjunction with a photograph of the flame in FIG. 3. The burner is preferably composed of four concentric tubes with outside/inside diameters of 6.4/4.6 mm, 12.7/10.9 mm, 25.4/19.1 mm and 75/70 mm. The reactants used and the configuration of injected feed depend on the desired products but all reactants are preferably introduced in the vapor phase. As clearly shown in FIG. 3, the halides are, typically, introduced through the central tube. The next flow stream supplies inert gas, followed by the reactive-metal vapor, and then an inert shroud gas in the outermost annular section. The reaction zone occurs in the mixing layer of the reactants. The inner inert stream acts as a diffusion barrier near the base to avoid particle deposition at the burner mouth. The outer inert shroud maintains a uniform flow and isolates the flame from ambient air or the reactor walls. Argon is preferably used as an inert rather than nitrogen to avoid the formation of nitrides. Of course, if nitrides are the desired product, nitrogen or ammonia could be added to the reactants. The flows can be adjusted to yield laminar or turbulent flames. For material production, the turbulent flame may be preferable because it yields a higher production rate and more uniform product. The basic processes of the present invention, however, are perhaps more readily explained with reference to a laminar flame. To ensure uniform laminar flows the annular channels or apertures are packed with stainless-steel wool and a honeycomb core is placed at the exit of the outermost annular section.

The system setup applicable to the production of powders of titanium metal and titanium boride, as discussed herein, can be adapted to other reactants as well. This "sodium" flame process may utilize any of several reactive metals (e.g. sodium or potassium) as the reducing species. Sodium is attractive, not just because of thermodynamic and by-product considerations for the reaction, but also because it has a reasonably low melting point (98° C.) which allows for flow regulation and metering in the liquid phase, and it has a sufficiently low boiling point (887° C.) that high-temperature stainless steels are satisfactory construction materials.

For the production of elemental Ti and $TiB_2$, titanium tetrachloride and boron trichloride are appropriate halides. As indicated, vapor-phase reactants are preferable and can be achieved with these chlorides. When producing elemental titanium in accordance with the present invention, $TiCl_4$ is the only chloride introduced through the central tube. For $TiB_2$ the two chloride flows are mixed in stoichiometric proportions (1:2 mole ratio of $TiCl_4$ to $BCl_3$). By reference to FIG. 1, it can be seen that, in a representative system of experimental scale, sodium is liquified in a 0.5 kg heated reservoir and pumped through a regulating valve to the vaporizer. Liquid sodium is metered by volumetric displacement. The vaporizer consists of a 4.6 mm ID stainless steel tube filled with densely-packed stainless steel filings to increase the vaporizing surface area and ensure an adequate pressure drop for flow stability. A cross flow of argon near the exit of the vaporizer also aids in giving a very steady sodium flow rate for flows of up to 0.3 cc/min of liquid sodium. The liquefier, vaporizer and stainless steel lines are heated to appropriate operating conditions to avoid solidification or condensation. As further shown representatively in FIG. 1, liquid titanium tetrachloride is stored in a 500 ml stainless steel reservoir. The reservoir is maintained at 150° C., producing a vapor pressure suitable to sustain the required flow rates. The vapor is piped through stainless steel lines, a regulating valve, and a mass flow meter, all heated to >150° C. to avoid condensation. The boron trichloride is metered with a rotameter calibrated with Ar at operating pressure. The metered $BCl_3$ is preheated before mixing with $TiCl_4$.

Argon can be introduced with any of the flows. The argon flow rates are metered with either calibrated sonic orifices or rotameters depending upon the flow range. The high flows of argon for the outer shroud are preheated with a Sylvania in-line heater, and brought to final temperature with heated lines.

The burner, reservoirs, vaporizer and lines are heated with thermally insulated heat tapes. For the high temperature lines (>500° C.) custom-made high-temperature heat tapes are used and are wrapped with ceramic-fiber blanket insulation. Type K thermocouples are used to monitor gas and wall temperatures. Thermocouple outputs are monitored, and heaters are controlled, with PC data-acquisition and control hardware and software. A sodium vapor lamp is used to detect the presence, uniformity, and stability of the sodium jet.

The outermost tube of the burner may be extended above the mouth of the burner by attaching a stainless steel or ceramic reactor tube. This measure minimizes heat loss from the flame and prevents entrainment of oxygen from the ambient air. While samples were obtained with the extension tube in place, the burner has been designed to be operated without it, and performs well in this mode. However, heat loss from the burner does limit the maximum temperature at the exit and reduces the maximum sodium concentration attainable without condensation.

Figure 1:
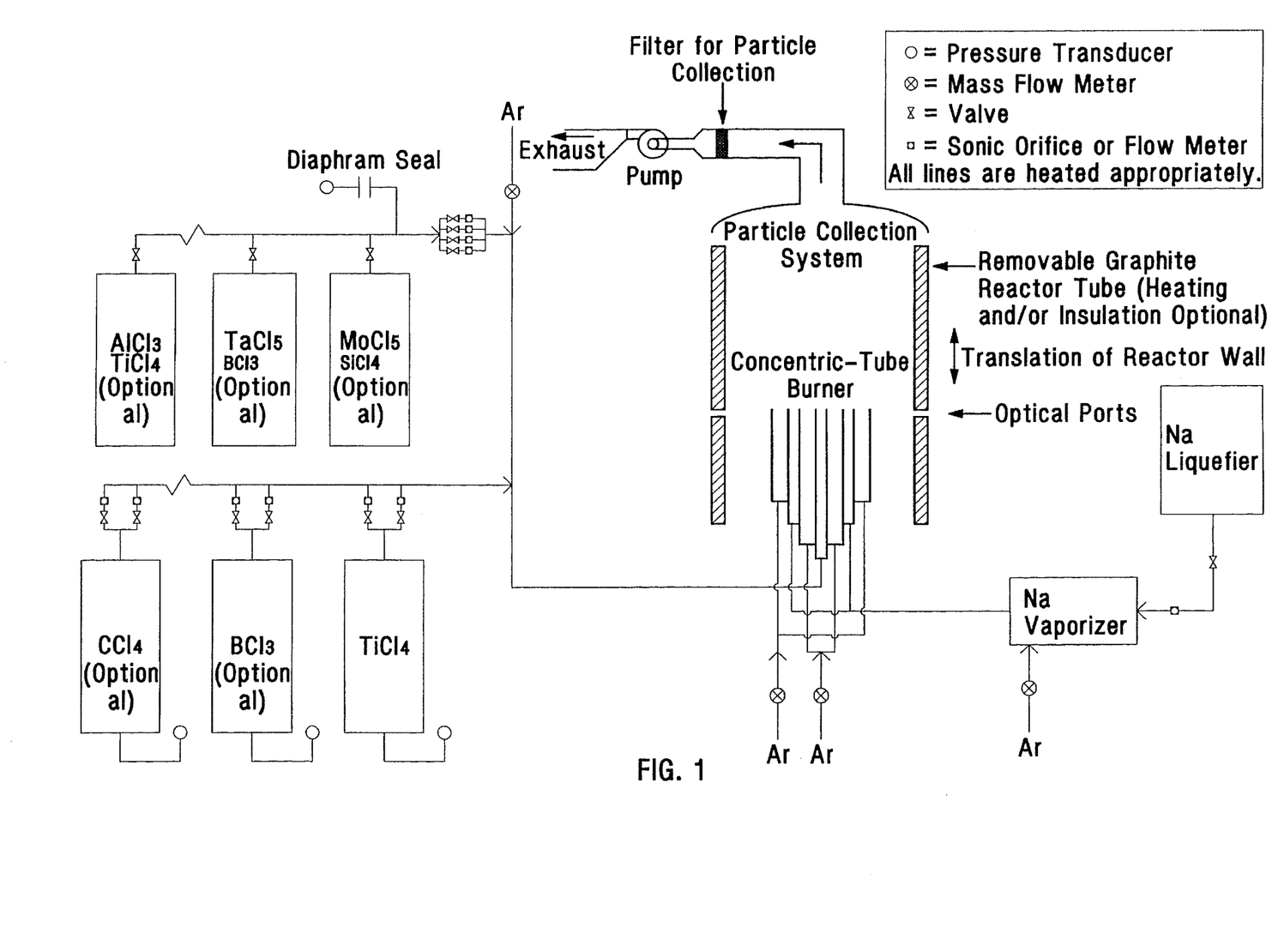

Flame generated particles are collected by convection means generally shown in FIG. 1 as reference numeral 10 which includes a ½" stainless steel tube positioned over the center of the burner, and in alignment with the burner exit. The plume emanating from the flame is a well-defined stream of particles, akin to soot breaking through a coflow hydrocarbon flame. These salt-coated particles are filtered onto a 10 micron porous stainless steel filter that can be heated to avoid sodium or halide condensation. The size of the pores in the filter has been observed to allow a considerable build-up of collected coated particles while continuing to allow gases to be drawn by the pump therethrough and exhausted. Due to the agglomeration among coated particles forming masses, few particles escape through the filter pores, resulting in near complete recovery of the desired reaction product. After collection, the particles are scraped from the filter and placed into storage vials.

Product particles were analyzed with a Rigaku vertical X-ray diffractometer (XRD). To determine particle size and morphology the salt agglomerates were analyzed with a JEOL 2000FX transmission electron microscope (TEM). Elemental analysis was performed in the TEM with a Noran 5402 energy dispersive x-ray spectrometer (EDS). Selected-area diffraction (SAD) was also performed with the TEM to determine composition of crystal phases.

A key thermodynamic aspect of reactions (1) and (2) above is that if the flame temperature is sufficiently low.(<1700° C.), nearly 100% yields can be achieved with these reactions. It has been observed that flame temperature can be controlled by argon dilution, the temperature of the reactants exiting the burner, and the reactor tube temperature.

Conceptually, the flame behaves much like a classic coflow diffusion flame although there are a number of differences. First, the flame is hypergolic. Second, the reactions have been observed to occur at temperatures below 400° C. Third, the primary products are condensed species and if the flame is operated below the saturation temperature of NaCl, all of the products will be condensed species.

System parameters have been varied over a range of flow rates and temperatures in order to identify conditions leading to a steady, stable flame where the NaCl will condense out onto the primary product particles. One such set of operating conditions is listed in Table 1 below. Flame A corresponds to an Na/TiCl$_4$/Ar flame for synthesizing elemental Ti while Flame B corresponds to an Na/TiCl$_4$/BCl$_3$/Ar flame for synthesizing TiB$_2$.

TABLE 1

Flow rates for the flames used to synthesize Ti and TiB2.
Flow rates in sccm. Gas temperature at burner exit is 1000K.

| | Product | Reactant flow rates | | | | Inner Coflow | Outer Coflow |
|---|---|---|---|---|---|---|---|
| | | BCl$_3$ | TiCl$_4$ | Ar | Na | Ar | | |
| Flame A | Ti | — | 4.5 | 500 | 50 | 1500 | 300 | 23000 |
| Flame B | TiB$_2$ | 10 | 5 | 15 | 130 | 1250 | 300 | 30000 |
| Flame C | Ti | — | 5 | 0 | 180 | 2000 | 300 | 30000 |
| Flame D | TiB$_2$ | 10 | 5 | 500 | 100 | 3000 | 500 | 30000 |

The heterogeneous nucleation of NaCl onto the product particles to encapsulate these particles is controlled by the partial pressure of NaCl, temperature, and particle size. Based on the conditions in Table 1 and estimates of flame temperature by thermocouple and optical pyrometer measurements, product particles have been discovered to coat rapidly and be of a size less than 10 nm.

Figure 4:
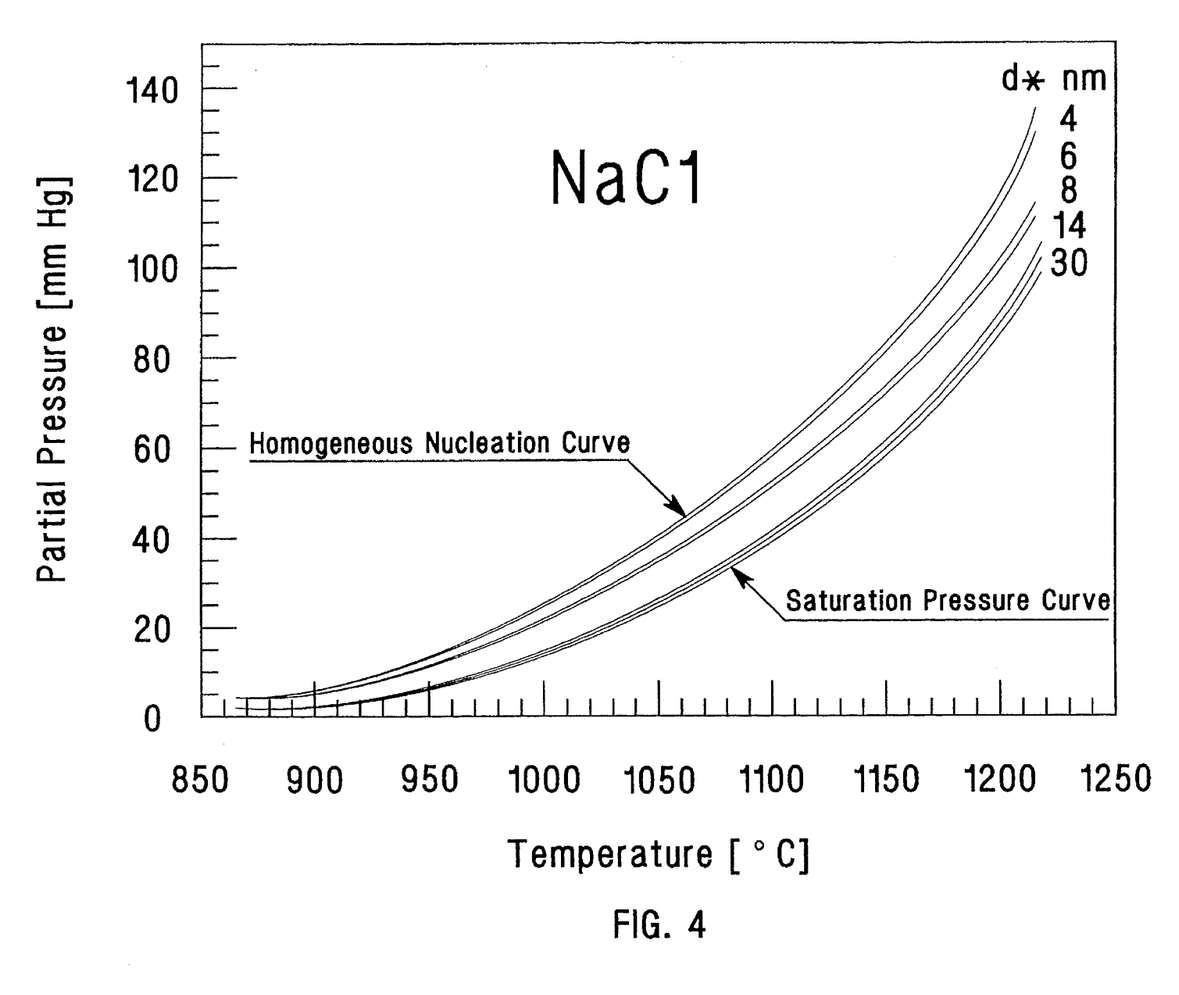

The calculated range of correspondingly desirable variables of temperature and partial pressure of NaCl in the present invention are plotted in FIG. 4. These variables have been determined in accordance with the Kelvin Equation $d_p^* = 4\sigma/\rho RT \ln(S)$, where $d_p^*$ is a critical size such that the particle is in a stable condition wherein evaporation and condensation rates are equal, $\sigma$ is the surface tension of the condensable material, $\rho$ the density, R the gas constant, T the temperature and S is the saturation ratio $S = p_i/p_{sat,i}$ where $p_i$ is the partial pressure of the condensable material i and $P_{sat,i}$ is the saturation pressure of i. For particles smaller than $d_p^*$ evaporation of i will occur, while for larger particles condensation will occur. This phenomena, termed the Kelvin effect, is significant for particles less than 50 nm. In FIG. 4, curves of NaCl partial pressure and temperature for a given $d_p^*$ are shown as are the homogenous-nucleation and saturation-pressure curves for NaCl. There are three possible modes of operation for coating, depending on whether, for a given NaCl partial pressure, the temperature is such that the system is operating to the left of the homogenous nucleation curve, to the right of the saturation pressure curve or in between the two curves. To the left of the homogeneous nucleation curve, NaCl will homogeneously nucleate out and the product will be some unknown combination of NaCl particles, primary particles, and NaCl-coated primary particles, depending on the temperature. To the right of the saturation pressure curve the NaCl will not condense out and the primary particles will grow unabated. Coating and subsequent encapsulation can be triggered by reducing the mixture temperature by, for example, sampling with a cold probe or allowing for downstream heat loss. In this way, particles larger than 30 nm and up to 1 micron can be produced. When the system is operated under conditions between these two curves, the Kelvin effect can be exploited. For a specified temperature and NaCl partial pressure the primary particle will grow unabated until the particle reaches a size $d_p^*$, wherein NaCl will begin to condense on the particle surface. At this stage there is considerably more NaCl vapor available compared to the primary-product vapor, and the subsequent particle growth will cause the condensation rate for the NaCl to rapidly increase and the particle will be encapsulated in NaCl. The primary particles so produced will have a well-defined size and a narrow but finite size distribution. Particle size is thereby thermodynamically controlled. While FIG. 4 gives nominal particle size, the actual size and size distribution for given operating conditions would be established by experiment.

In the below examples the primary particles are produced from a flame or some other process and the product gases contain NaCl and inert gas. The NaCl is either a product of the reaction or it is introduced independent of the primary reaction.

EXAMPLE 1

Figure 2A:
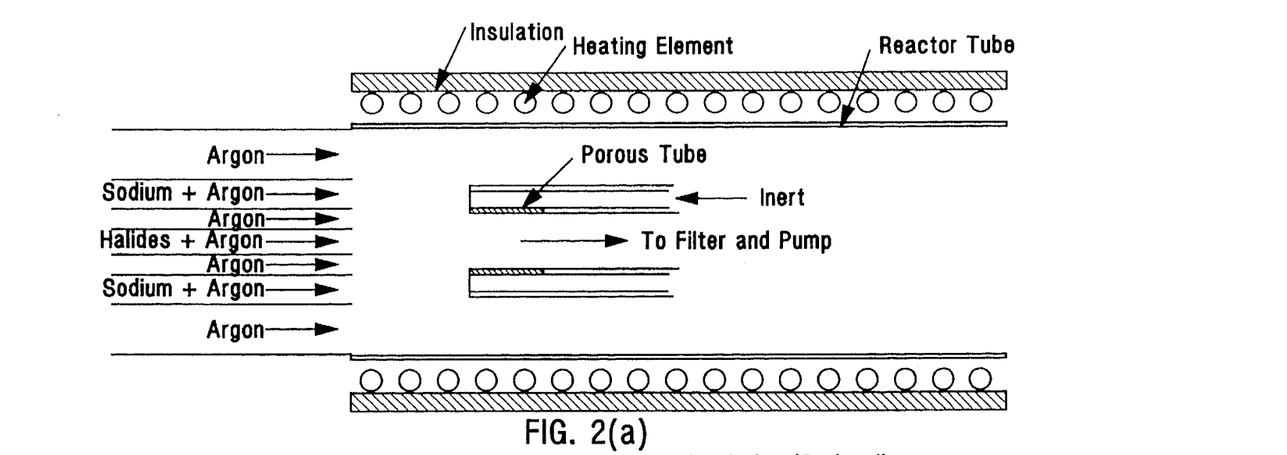

In this embodiment, shown in FIG. 2a, the walls of the reactor are heated and/or insulated to minimize heat loss from the products. The product temperature is greater than the saturation temperature for NaCl and the primary particles will grow unabated. When the particles have grown to the appropriate size they are extracted into a cooled collection probe where their temperature is decreased. The NaCl then rapidly encapsulates the primary particles, freezing their size and avoiding subsequent agglomeration of primary particles. Under these conditions particles greater than 30 nm can be obtained.

EXAMPLE 2

Figure 2B:
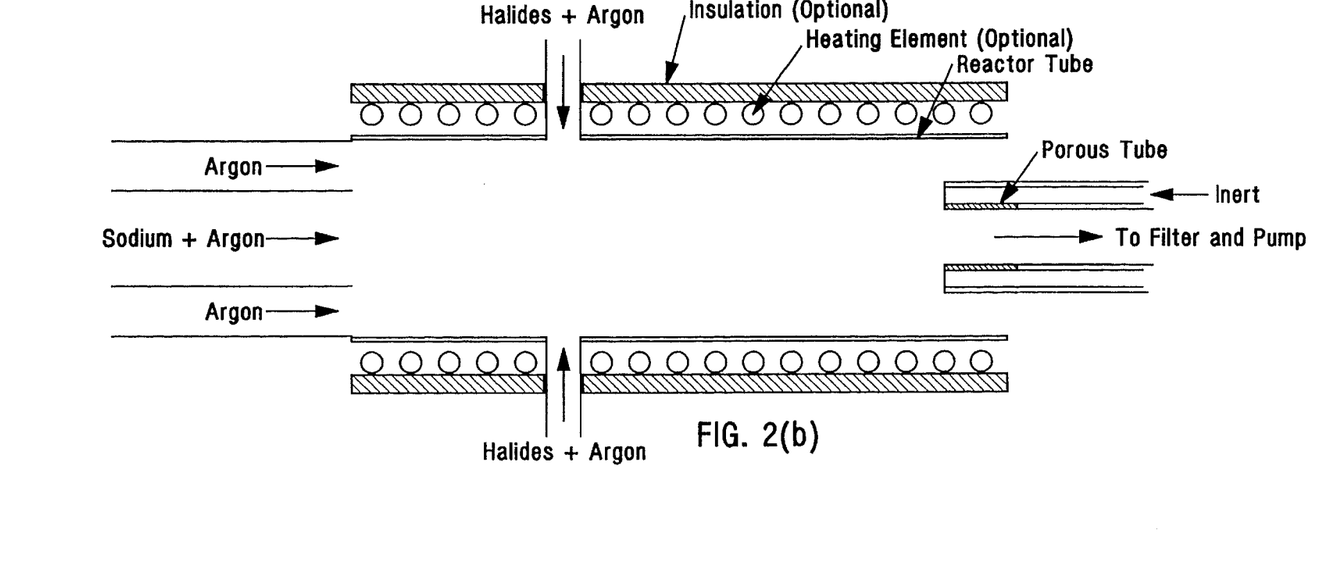

In this embodiment, shown in FIG. 2b, the wall temperature of the reactor is less than the temperature of the products which is greater than the saturation temperature of NaCl. Product temperature will drop due to heat loss and at some point the temperature, partial pressure of NaCl and primary-particle size will reach a condition, as represented in FIG. 4, wherein the NaCl will begin to condense out, encapsulating the primary particles. Placement of the particle collection probe is not critical in this embodiment; it can be located far downstream at the exit of the reactor tube.

EXAMPLE 3

In this embodiment the walls of the reactor are heated or insulated as in Example 1 to minimize heat loss from the products. The product temperature and partial pressure of NaCl are such that homogeneous nucleation of the NaCl will not occur but the partial pressure is below the saturation pressure (S>1). For example, the product and reactor-wall temperature is 1150° C. and the partial pressure of NaCl is 55 mm Hg. Under these conditions the primary particles will grow until their diameters are greater than about 14 nm (see FIG. 4) at which time the particle will be coated with NaCl. As with Example 2, placement of the particle collection probe is not critical in this embodiment and it can be located far downstream at the exit of the reactor tube, as in FIG. 2b.

The typical operating procedure is as follows: The temperature and flow of the sodium/argon mixture are stabilized and then the chloride or chloride mixture is introduced until the desired flame is established. The inner argon coflow is adjusted to avoid particle deposition at the burner mouth.

Particle deposition can be a particular problem with this type of flame because, as noted above, the products at the tube exit are primarily condensed phase since the temperature at the rim is below the saturation temperature of NaCl. Therefore, unlike a hydrocarbon flame, the inner inert coflow provided by the present invention is a practical requirement for this laminar sodium flame. The low temperature hypergolic reactions make particle deposition a problem, yet they also make it possible to have a stable flame with a substantial inner argon coflow. Hydrocarbon flames will blow off if small amounts of inert are introduced between the fuel and the oxidizer because flame stabilization is achieved at the base. With this flame, mixing is the only requirement for a stable flame and, provided that care is exercised in maintaining uniform steady flows, a stable flame can be generated even when flow rates for the inner argon coflow are well in excess of the chloride flow rates.

Particle deposition at the burner mouth can also be suppressed by diluting the reactant streams. Flame A, which is heavily diluted, yet still stable, experiences negligible buildup of particles at the rim, whereas Flame B, which is less dilute, experiences minor buildup over extended periods of operation.

Figure 5:
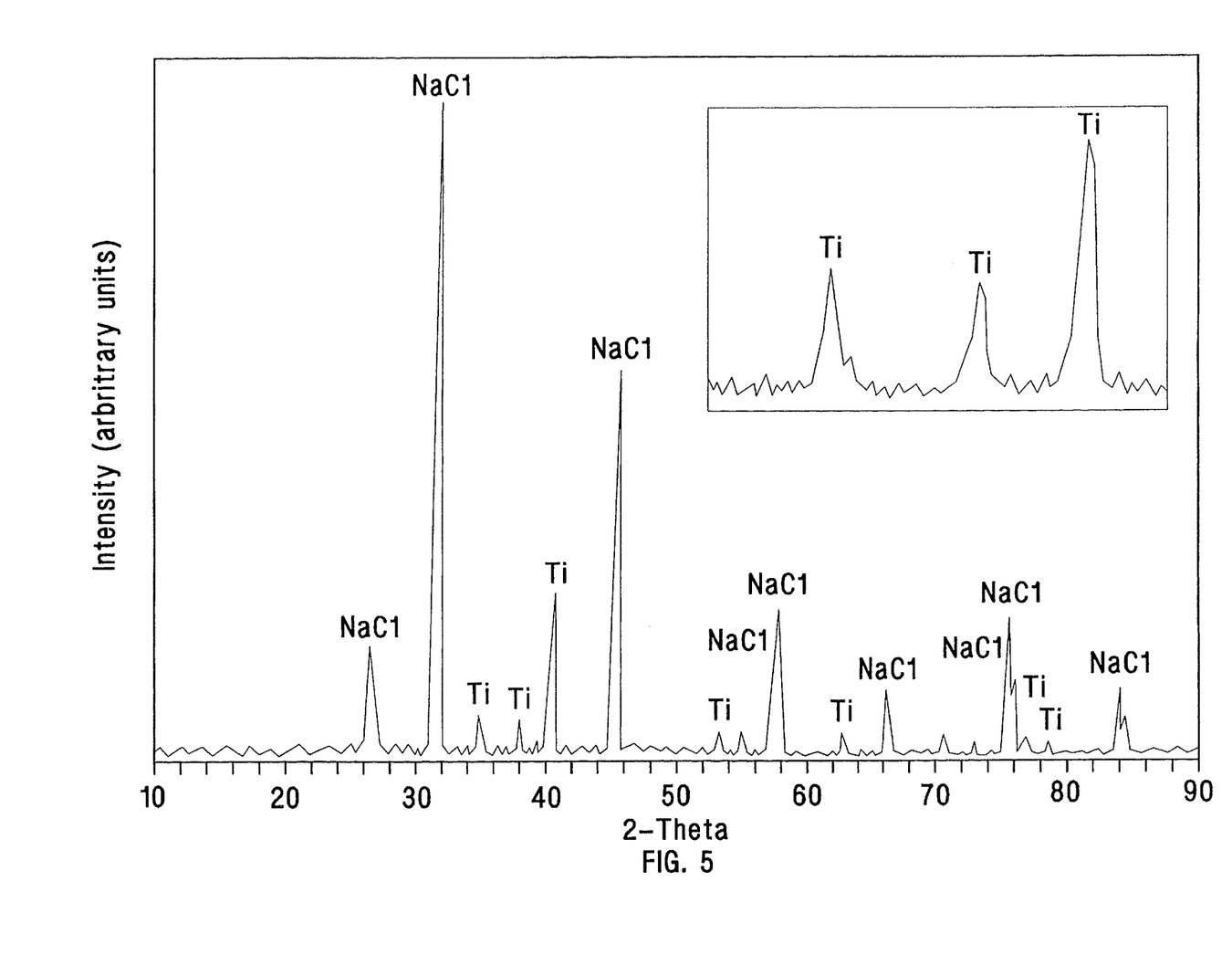

With sodium flame synthesis, practiced in accordance with the present invention, it is a rather straightforward procedure to produce nanoparticles of elemental titanium. FIG. 5 shows an XRD analysis of the powder generated under the conditions in Table 1. This analysis is for an as-produced powder that was stored in air for three days and then analyzed in air. All peaks accurately index to either NaCl or Ti, suggesting that the salt coating acts as an effective barrier to oxidation. In Siegel et al. U.S. Pat. No. 5,128,081, uncoated Ti particles were found to react to rutile $TiO_2$ when rapidly exposed to air. The XRD pattern also gives an estimate of nominal particle size because the width of the peak is inversely related to crystal size. These peaks correspond to 30 nm for Ti and 70 nm for NaCl.

Figure 6A:
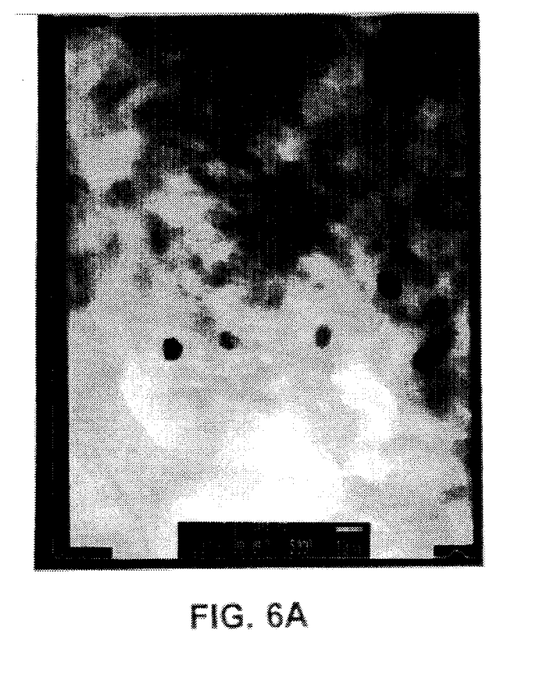

TEM micrographs (see FIG. 6) identify the morphology of typical Ti particles and the NaCl coating and matrix. The overall appearance of the image shown in FIG. 6a is an agglomerate of about 10 nm particles in an NaCl matrix. Elemental analysis by EDS reveals the presence of Na, Cl, O and Ti in the agglomerate but when the electron beam is focused onto the individual particles the amount of Ti increases an order of magnitude. This suggests that the matrix containing the agglomerates is composed of NaCl while the individual particles are Ti. The distinct dark images in FIG. 6 are from particles where the crystal lattice is oriented to strongly diffract the electron beam. Other particles are present but they are less apparent because they are not diffracting and are contained within the agglomerate.

The flame temperature was estimated to be near the temperature for homogenous nucleation of the NaCl, indicating that Ti particles would be rapidly coated with NaCl. Therefore, the particles in FIG. 6 are representative of the estimated particles size based on classical nucleation theory. A small fraction of larger particles observed accounts for the XRD analysis yielding a nominal particle size of 30 nm.

The synthesis of $TiB_2$ in a sodium flame, in accordance with the present invention, is similar to that of Ti except that the chlorides must be accurately mixed in stoichiometric proportions. Under the operating conditions of Table 1, the products are NaCl and $TiB_2$. Unlike the Ti nanoparticles, the $TiB_2$ particles are marginally stable in air and the salt can be removed before performing the XRD analysis. In bulk form or as micron-sized particles, $TiB_2$ is considered to be oxidation resistant. However, it has been observed that ultrafine powders can oxidize in air, particularly when the NaCl is removed by sublimation at 800° C. under dynamic vacuum.

Figure 7:
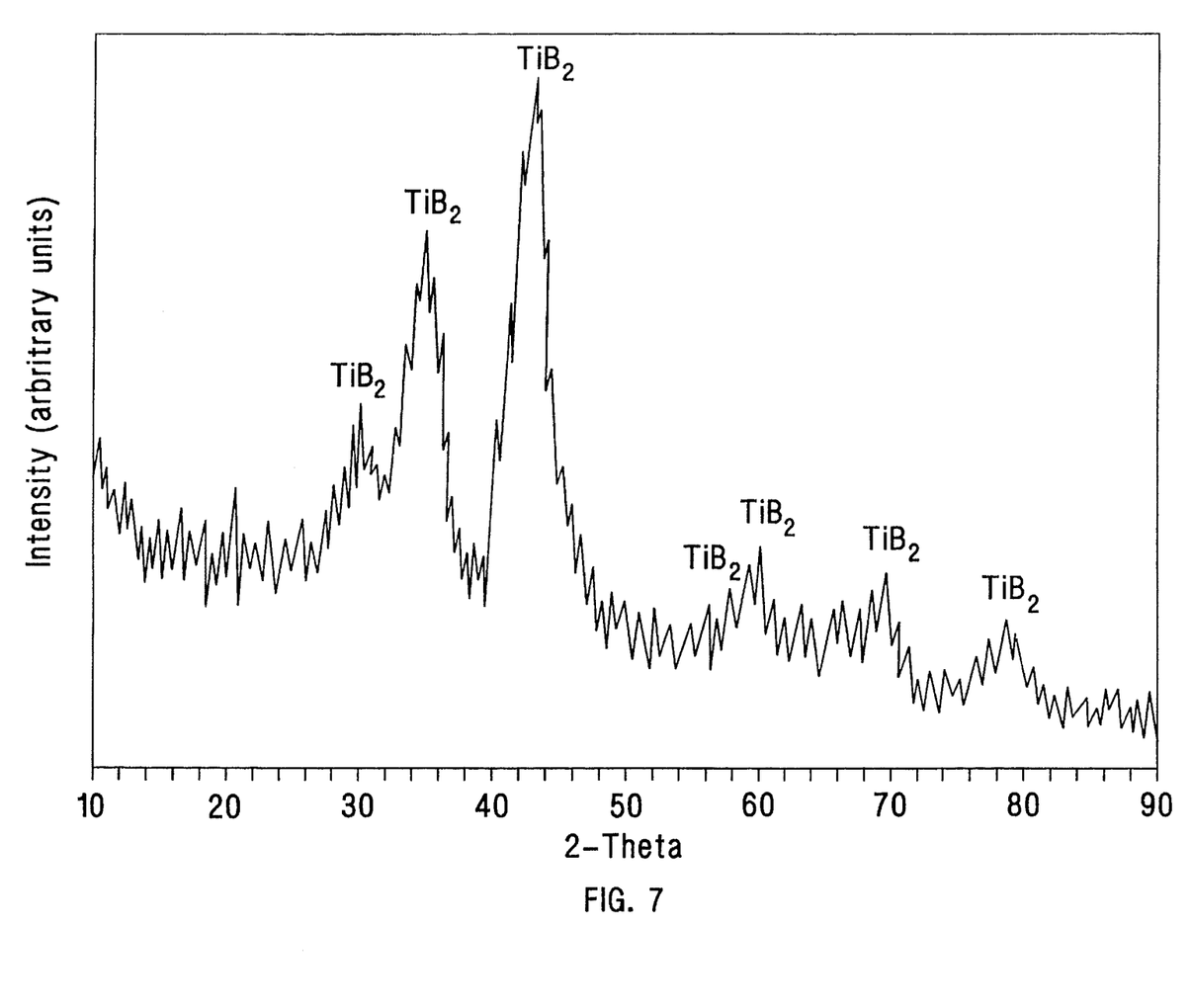

FIG. 7 is an XRD spectra of a typical $TiB_2$ sample produced under the conditions of Table 1. The NaCl has been removed by water wash and centrifuge. The peaks in the spectra index to $TiB_2$ and show a nominal particle size of 6 nm. The large amorphous background suggests that the particles are either not fully crystalline or that much finer particles exist.

Figure 6B:
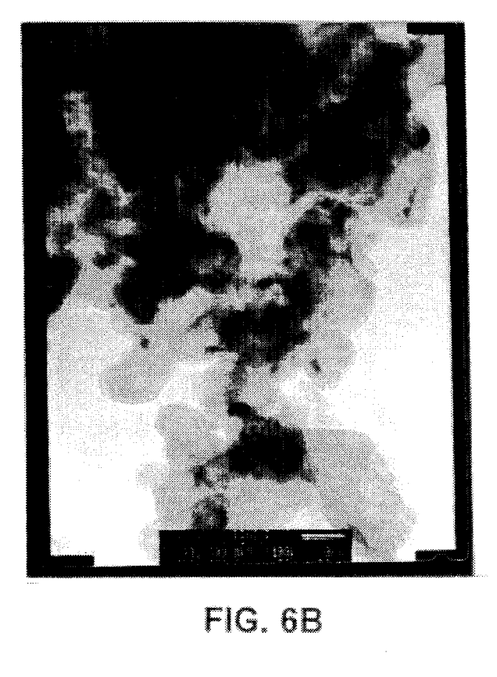

TEM observations of the washed sample revealed large agglomerates of TiB2. For particles this small it was not possible to discern whether these were hard agglomerates generated in the flame or whether the agglomeration occurred during washing. However, based on the observations for Flame A, where the Ti particles in the as-prepared samples were coated with NaCl, it is reasonable to expect that the agglomerates occurred during the washing process. Therefore, these would be weak agglomerates, which is not an inherent problem for subsequent processing. To confirm this possibility, TEM samples of the as-prepared sample were analyzed. A typical TEM is shown in FIG. 6b. SAD shows that the dominant phase in these agglomerates is $TiB_2$. As with the Ti sample in FIG. 6a, EDS reveals large atomic concentrations of Ti when the beam is focused on particles and not the matrix (the system cannot detect boron). Closer inspection of FIG. 6b reveals that the particles are jacketed with a ~2 nm coating of a less dense material. EDS reveals this material to be predominantly Na and Cl. The $TiB_2$ particles appear coated with NaCl, suspended in an NaCl matrix and are less than 10 nm, which is in excellent agreement with the 6 nm size measured by XRD.

While the present invention has been described by reference to specific embodiments, it should be understood that modifications and variations of the invention may be constructed without departing from the scope of the invention as defined in the following claims.

What is claimed is:

1. A method for producing coated submicron particles comprising the steps of:
    combustion reacting a vaporized metal composition with a vaporized halide composition in an environment of inert gas, said reaction producing a condensable by-product, and
    controlling the pressure and temperature of said environment to be within a range of heterogeneous nucleation so that said condensable by-product condenses on any particles nucleated by said reaction as they reach a size within the range of approximately 1 to 100 nanometers.

2. The method of claim 1 further comprising the step of determining the size of said particles by varying said pressure and said temperature within said environment.

3. The method of claim 2 wherein the step of combustion reacting includes the step of combusting the compositions within a flame of a coflow burner, in which each of said vaporized metal composition, said vaporized halide composition, and said inert gas are fed through a central or annular orifice of said coflow burner.

4. The method of claim 3 wherein the step of controlling the pressure and temperature includes the step of controlling the partial pressure of any one or more of said vaporized metal composition, said vaporized halide composition or said inert gas.

5. The method of claim 3 further comprising the step of collecting said coated particles by passing the output of said combustion reaction through a filter, said particles collecting on said filter for later removal.

6. The method of claim 5 further comprising the step of recovering said particles by removing said coating.

7. The method of claim 6 wherein the step of removing the coating includes the step of washing the particles.

8. The method of claim 6 wherein the step of removing the coating includes the step of sublimating the coating from the particles.

9. The method of claim 6 wherein the step of removing the coating includes the step of vaporizing the coating from the particles.

10. A method of producing coated submicron particles comprising the steps of:
    synthesizing discrete homogeneous particles in the presence of a vaporous coating material, all within an environment of inert gas, and
    thermodynamically controlling the condensation of said coating material to thereby individually coat said discrete particles once they grow to a size within the range of approximately 1 to 100 nanometers.

11. The method of claim 10 wherein the synthesizing step includes the step of introducing a continuous flow of a vaporized halide and a continuous flow of a vaporized reducing metal into a burner for flame synthesis.

12. The method of claim 11 wherein the introducing step includes the step of controlling the rate of flow of one or both of said vaporized halide and vaporized reducing metal to thereby produce a laminar flame.

13. The method of claim 11 wherein the introducing step includes the step of controlling the rate of flow of one or both of said vaporized halide and vaporized reducing metal to thereby produce a turbulent flame.

14. The method of claim 11 wherein the step of thermodynamically controlling the condensation includes the step of controlling the pressure and temperature to be at saturation for a Kelvin effect condensation of said coating material on discrete particles of a critical size.

15. The method of claim 11 wherein the step of thermodynamically controlling the condensation includes the steps of controlling the pressure and temperature of the environment to be greater than saturation level for said coating material, and reducing the temperature of at least a portion of said environment to thereby force the condensation of said coating material on said particles.

16. The method of claim 11 wherein said burner is a coflow burner with a plurality of annular orifices, and the introducing step includes the step of introducing said vaporized halide and vaporized reducing metal through said annular orifices.

17. The method of claim 11 wherein said burner is a jet burner with cross flow, and the introducing step includes the step of introducing at least one of said vaporized halide or said vaporized reducing metal as a cross flow.

18. The method of claim 15 wherein the step of reducing the temperature includes the step of inserting a probe into said environment to thereby locally cool a portion of said environment.

19. The method of claim 15 wherein the step of reducing the temperature includes the step of allowing the environment to cool.

20. A method of producing coated submicron particles comprising the steps of:
    creating a vaporous mixture of at least a vaporous metal composition and a vaporous coating material, and
    controlling the pressure and temperature of said vaporous mixture to first grow discrete particles of said metal composition to a size within the range of approximately 1 to 100 nanometers and second to condense said coating material on said particles as they reach said size.

21. The method of claim 20 wherein the step of creating a vaporous mixture includes the step of isolating said mixture in a vaporous environment of an inert gas.

22. The method of claim 21 wherein the step of creating a vaporous mixture includes the step of synthesizing said vaporous mixture.

23. The method of claim 22 wherein the step of synthesizing includes the step of flame synthesizing.

24. The method of claim 21 wherein the step of creating a vaporous mixture includes the step of introducing each of said vaporous metal composition and said vaporous coating material into said vaporous mixture.

25. The method of claim 23 further comprising the step of collecting the coated particles.

26. The method of claim 25 further comprising the step of removing the coating from the particles.

27. An apparatus for flame synthesizing coated unagglomerated particles comprising: a coflow burner, means for introducing a plurality of constituent vapors into said coflow burner, means for controlling the pressure and temperature surrounding said coflow burner to thereby produce coated particles, and means for collecting any combustion products produced by said coflow burner including a filter for collecting said coated particles.

28. A method for producing coated submicron particles comprising the steps of:

combustion reacting a vaporized metal composition with a vaporized halide composition in an environment of gas, said reaction producing a condensable by-product, and controlling the pressure and temperature of said environment to be within a range of heterogeneous nucleation so that said condensable by-product condenses on any particles nucleated by said reaction as they reach a size within the range of approximately 1 to 100 nanometers.

29. The method of claim 28 further comprising the step of determining the size of said particles by varying said pressure and said temperature within said environment.

30. The method of claim 29 wherein the step of combustion reacting includes the step of combusting the compositions within a flame of a coflow burner, in which each of said vaporized metal composition, said vaporized halide composition, and said gas are fed through a central or annular orifice of said coflow burner.

31. The method of claim 30 wherein the step of controlling the pressure and temperature includes the step of controlling the partial pressure of any one or more of said vaporized metal composition, said vaporized halide composition or said gas.

32. The method of claim 30 further comprising the step of collecting said coated particles by passing the output of said combustion reaction through a filter, said particles collecting on said filter for later removal.

33. The method of claim 32 further comprising the step of recovering said particles by removing said coating.

34. The method of claim 33 wherein the step of removing the coating includes the step of washing the particles.

35. The method of claim 33 wherein the step of removing the coating includes the step of sublimating the coating from the particles.

36. The method of claim 33 wherein the step of removing the coating includes the step of vaporizing the coating from the particles.

37. A method of producing coated submicron particles comprising the steps of:

synthesizing discrete homogeneous particles in the presence of a vaporous coating material, all within an environment of gas, and thermodynamically controlling the condensation of said coating material to thereby individually coat said discrete particles once they grow to a size within the range of approximately 1 to 100 nanometers.

38. The method of claim 37 wherein the synthesizing step includes the step of introducing a continuous flow of a vaporized halide and a continuous flow of a vaporized reducing metal into a burner for flame synthesis.

39. The method of claim 38 wherein the introducing step includes the step of controlling the rate of flow of one or both of said vaporized halide and vaporized reducing metal to thereby produce a laminar flame.

40. The method of claim 38 wherein the introducing step includes the step of controlling the rate of flow of one or both of said vaporized halide and vaporized reducing metal to thereby produce a turbulent flame.

41. The method of claim 38 wherein the step of thermodynamically controlling the condensation includes the step of controlling the pressure and temperature to be at saturation for a Kelvin effect condensation of said coating material on said discrete particles.

42. The method of claim 38 wherein the step of thermodynamically controlling the condensation includes the steps of controlling the pressure and temperature of the environment to be greater than saturation level for said coating material, and reducing the temperature of at least a portion of said environment to thereby force the condensation of said coating material on said particles.

43. The method of claim 38 wherein said burner is a coflow burner with a plurality of annular orifices, and the introducing step includes the step of introducing said vaporized halide and vaporized reducing metal through said annular orifices.

44. The method of claim 38 wherein said burner is a jet burner with cross flow, and the introducing step includes the step of introducing at least one of said vaporized halide or said vaporized reducing metal as a cross flow.

45. The method of claim 42 wherein the step of reducing the temperature includes the step of inserting a probe into said environment to thereby locally cool a portion of said environment.

46. The method of claim 42 wherein the step of reducing the temperature includes the step of allowing the environment to cool.

* * * * *

UNITED STATES PATENT AND TRADEMARK OFFICE
CERTIFICATE OF CORRECTION

PATENT NO. : 5,498,446
DATED : March 12, 1996
INVENTOR(S) : Axelbaum, et al.

It is certified that error appears in the above-indentified patent and that said Letters Patent is hereby corrected as shown below:

On the title page, Item [75]: "Inventors:" add --Lee J. Rosen, Atlanta, GA.--

Signed and Sealed this

Twenty-third Day of July, 1996

Attest:

BRUCE LEHMAN

*Attesting Officer*          *Commissioner of Patents and Trademarks*